United States Patent [19]

Bayerer

[11] Patent Number: 5,744,861
[45] Date of Patent: Apr. 28, 1998

[54] POWER SEMICONDUCTOR MODULE

[75] Inventor: Reinhold Bayerer, Reichelsheim, Germany

[73] Assignee: Asea Brown Boveri AG, Baden, Switzerland

[21] Appl. No.: 558,021

[22] Filed: Nov. 13, 1995

[51] Int. Cl.⁶ .................................................. H01L 23/52
[52] U.S. Cl. ............................ 257/691; 257/723; 257/724; 257/725
[58] Field of Search ................................. 257/723, 691, 257/724, 725

[56] References Cited

U.S. PATENT DOCUMENTS 5,371,405  12/1994  Kagawa ........................ 257/725
5,488,256  1/1996   Tsunoda ........................ 257/724

FOREIGN PATENT DOCUMENTS 0 597 144  5/1994  European Pat. Off. .

*Primary Examiner*—Tom Thomas
*Assistant Examiner*—Roy Potter
*Attorney, Agent, or Firm*—Oblon, Spivak, McClelland, Maier & Neustadt, P.C.

[57] ABSTRACT

In a power semiconductor module (10), in which a plurality of individual controllable power semiconductors in the form of semiconductor chips (13, 15, 16) are arranged alongside one another and electrically connected on a common module substrate (11), electrical connection to the surroundings with an appreciable reduction in the required surface area of the module or substrate is achieved by virtue of the fact that the control connections (23-25) of a plurality of the controllable power semiconductors are brought together on a second plane which is vertically offset with respect to the plane of the module substrate (11).

8 Claims, 1 Drawing Sheet

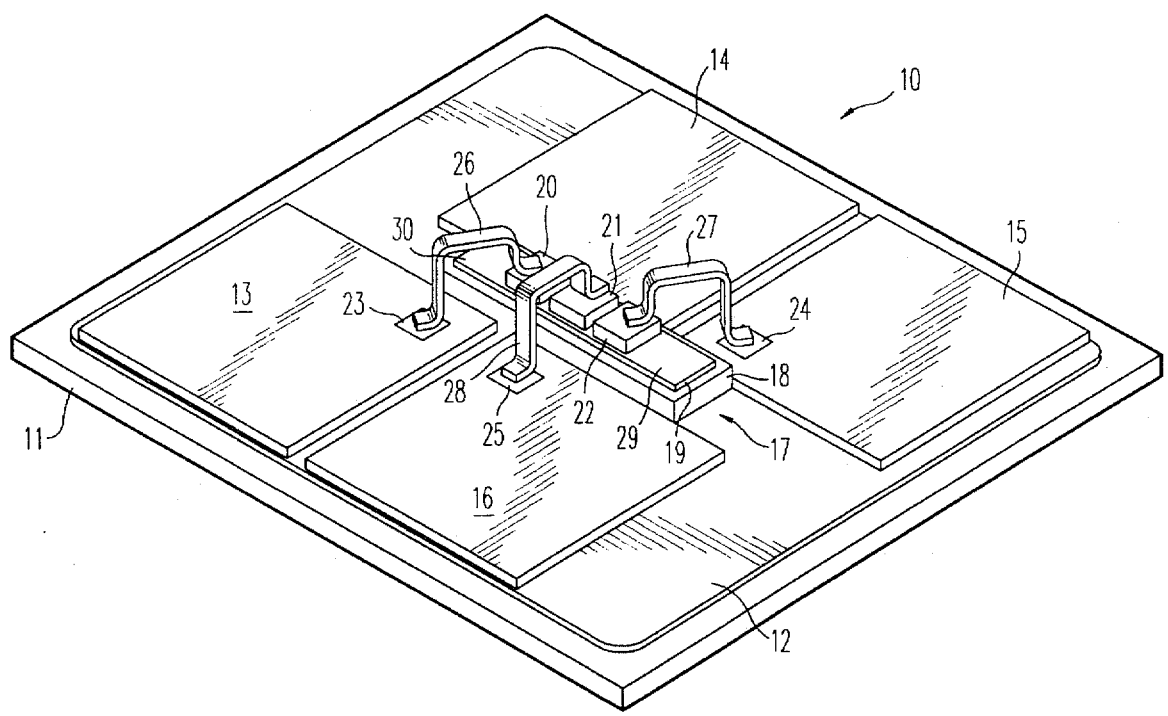

POWER SEMICONDUCTOR MODULE

BACKGROUND OF THE INVENTION

1. Field of the Invention

The present invention is concerned with the field of power electronics. It relates to a power semiconductor module, in which a plurality of individual controllable power semiconductors in the form of semiconductor chips are arranged alongside one another and electrically connected on a common module substrate.

2. Discussion of Background

Modules of this type are disclosed, for example, in EP-A1-0 597 144.

Power semiconductor modules, such as those described in the publication cited in the introduction, and such as those which are accommodated in a common housing for the composition of larger functional blocks such as, for example, half-bridges for converter purposes or the like, frequently comprise a plurality of semiconductor chips which are arranged alongside one another on a common ceramic substrate. In this case, the (metallized) ceramic substrate has a conductor track structure.

The conductor track structure contains a relatively large area for soldering on semiconductor chips (by the collector connection area situated at the bottom in the case of IGBTs or Insulated Gate Bipolar Transistors) as well as further tracks of smaller area for the bonding or chip soldering and intermediate contact-making of the top contacts of the semiconductors and control electrodes (the emitter connection area and the gate connections in the case of IGBTs). In this case, the tracks, which are at different potentials, have to be arranged with a greater or lesser separation from one another according to the voltage which occurs.

In the case of modules for high voltages in the region of 1000V or more, considerable portions of the surface area have to be made available on the substrate for the separations between the tracks. Particularly when high-quality, expensive ceramics such as, for example, AlN are used, this type of design leads to considerable additional costs.

SUMMARY OF THE INVENTION

Accordingly, one object of the invention is to provide a novel power semiconductor module which manages with appreciably less surface area of the module or substrate for its electrical connection to the surroundings.

The object is achieved, in the case of a power semiconductor module of the type mentioned in the introduction, by virtue of the fact that the control connections of a plurality of the controllable power semiconductors are brought together on a second plane which is vertically offset with respect to the plane of the module substrate. By virtue of the vertically offset second plane, it is possible at the same time to keep the lateral extent of the substrate small, and the necessary insulation can be achieved by virtue of the vertical separation.

According to a first preferred embodiment, the second plane is provided by the top side of a connecting rail which is placed onto the substrate and is arranged next to the semiconductor chips. This forms a robust and compact connection region.

Particularly favorable in respect of the electrical and mechanical properties is the structure according to a further preferred embodiment, in which the connecting rail comprises a ceramic substrate provided with a metallization layer, the thickness of the ceramic substrate is selected according to the required dielectric strength, the module substrate is designed as a ceramic substrate provided with a metallization layer, and the connecting rail is soldered onto the module substrate. In this case, the module substrate can be produced from a high-quality ceramic, in particular AlN, and the connecting rail can be produced from a further ceramic, in particular $Ae_2O_3$.

Further simplifications emerge for the structure of the module if, according to another preferred embodiment, series resistors are respectively inserted between the semiconductor chips and the connecting rail, if the series resistors are designed as chip-shaped components, if the series resistors are soldered alongside one another by their underside onto the connecting rail, and if the connecting wires are respectively connected to the top side of the series resistors.

Further embodiments emerge from the dependent claims.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawing, wherein the single FIGURE shows a perspective illustration of a preferred exemplary embodiment of a module according to the invention.

DESCRIPTION OF THE PREFERRED EMBODIMENT

Referring now to the drawing, the single FIGURE represents a perspective illustration of a preferred exemplary embodiment of a power semiconductor module according to the invention. The power semiconductor module 10 is constructed on a rectangular or square module substrate 11 which comprises a carrier ceramic with a metallization layer 12 applied on top. The ceramic material used is preferably AlN, on account of the favorable thermal properties, in order to enable the heat loss generated by the semiconductors to be readily dissipated downwards.

Various planar, likewise rectangular or square semiconductor chips 13, 14, 15 and 16 are soldered onto the metallization layer 12 of the module substrate 11. Three of the semiconductor chips, namely the chips 13, 15 and 16, contain a controllable power semiconductor (for example in the form of an IGBT). For the purpose of driving, control connections 23, 24 and 25 (these are gate connections in the case of IGBTs) are provided on the top side of these chips, which control connections have to be connected within the module and externally. The semiconductor chip 14 is designed as a simple diode and, accordingly, does not have its own control connection.

On their underside, the semiconductor chips 13 to 16 have a metallization layer which is connected to an electrode of the corresponding component (collector in the case of the IGBT, cathode in the case of the diode) and produces the connection to the module substrate via the soldered joint. The further electrodes and their connections (emitter in the case of the IGBT, anode in the case of the diode), which are arranged on the top side of the chips and with which contact is made, for example, by means of lugs soldered on from above, are omitted in the figure for the sake of simplicity.

In order to reduce the area for wiring on the module substrate, a raised connecting rail ("gate runner") 17 is arranged on the top side of the module substrate between the semiconductor chips 13 to 16. The connecting rail 17 comprises a ceramic substrate 18 which is soldered (or bonded) onto the module substrate 11 and comprises, for example, a simple $Ae_2O_3$ ceramic. Provided on the top side of the connecting rail 17 is a metallization layer 19 which serves as a second plane above the plane of the module substrate for bringing together the control connections 23–25 of the semiconductor chips 13, 15, 16.

The connection of the individual semiconductor chips 13, 15, 16 or control connections 23–25 to the connecting rail 17 is effected via connecting wires 26–28, which are passed in a curve from the control connections 23–25 to the connecting rail 17. The connecting wires are soldered by one end onto the control connections 23–25. They are soldered by the other end onto the top side of chip-shaped series resistors 20–22, which are soldered alongside one another by their undersides onto the connecting rail 17. In this case, each of the control connections 23–25 is assigned one of the series resistors 20–22.

The series resistors 20–22 are concentrated in the center region of the connecting rail 17, so that a respective connection area 29 and 30 remains free on the metallization layer at the two transverse sides of the rail, on which connection areas upwardly outgoing connections (wires or the like) for the control of the power semiconductors can be soldered on or fixed in some other way. The necessary insulation of the connecting rail 17 from the potential on the module substrate 11 is achieved by suitable selection of the thickness of the ceramic substrate 18.

Overall, the invention yields a power semiconductor module having an area-saving and compact structure in conjunction with high mechanical stability and an outstanding dielectric strength.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters patent of the United States is:

1. A power semiconductor module, in which a plurality of individual controllable power semiconductors in the form of semiconductor chips are arranged alongside one another and electrically connected on a common module substrate, wherein the control connections of a plurality of the controllable power semiconductors are brought together on a second plane which is vertically offset with respect to the plane of the module substrate;

wherein the second plane is provided by the top side of a connecting rail which is placed onto the substrate and is arranged next to the semiconductor chips, wherein the electrical connection between the semiconductor chips and the connecting rail is effected via connecting wires which run from the respective semiconductor chip to the connecting rail, and wherein series resistors are respectively inserted between the semiconductor chips and the connecting rail.

2. The power semiconductor module as claimed in claim 1, wherein the connecting rail comprises a ceramic substrate provided with a metallization layer.

3. The power semiconductor module as claimed in claim 2, wherein the thickness of the ceramic substrate is selected according to the required dielectric strength.

4. The power semiconductor module as claimed in claim 2, wherein the module substrate is designed as a ceramic substrate provided with a metallization layer, and wherein the connecting rail is soldered onto the module substrate.

5. The power semiconductor module as claimed in claim 4, wherein the module substrate is produced from AlN, and wherein the connecting rail is produced from $Ae_2O_3$.

6. The power semiconductor module as claimed in claim 1, wherein the series resistors are designed as chip-shaped components, wherein the series resistors are soldered alongside one another by their underside onto the connecting rail, and wherein the connecting wires are respectively connected to the top side of the series resistors.

7. The power semiconductor module as claimed in claim 1, wherein free connection areas are provided on the connecting rail, for external connection of the connecting rail.

8. The power semiconductor module as claimed in claim 1, wherein the controllable power semiconductors are designed as IGBTs (Insulated Gate Bipolar Transistors).

* * * * *